United States Patent [19] [11] 4,032,800
Dröscher et al. [45] June 28, 1977

[54] LOGIC LEVEL CONVERSION SYSTEM

[75] Inventors: Walter Dröscher; Kurt Winter, both of Vienna, Austria; Werner Meier, Erlangen, Germany

[73] Assignee: Siemens Aktiengesellschaft, Munich, Germany

[22] Filed: Apr. 7, 1975

[21] Appl. No.: 565,678

[30] Foreign Application Priority Data

Apr. 8, 1974 Germany .................... 2417054

[52] U.S. Cl. .................. 307/296 A; 307/DIG. 1; 307/350; 307/318
[51] Int. Cl.² .................................. H03K 17/00
[58] Field of Search .......... 307/DIG. 1, 235 R, 264, 307/318, 296

[56] References Cited

UNITED STATES PATENTS 3,581,107 4/1971 Nielsen .................. 307/DIG. 1
3,739,200 6/1973 D'Agostino .................. 307/DIG. 1

FOREIGN PATENTS OR APPLICATIONS 1,291,365 3/1969 Germany

OTHER PUBLICATIONS

Silicon Zener Diode and Rectifiers Hand Book, by Motorola, p. 110.

Primary Examiner—Stanley D. Miller, Jr.
Assistant Examiner—B. P. Davis
Attorney, Agent, or Firm—Kenyon & Kenyon, Reilly, Carr & Chapin

[57] ABSTRACT

A circuit arrangement which permits interfacing logic systems operating on different logic levels and thus requiring different supply voltages in which the supply voltage for the logic system having the smaller signal excursion is obtained by means of a pair of zener diodes connected in series across the potential and reference potential of the logic system having a larger signal excursion to develop a potential and reference potential for the system having smaller signal excursions lying between the respective potential and reference potential levels of the system having larger excursions.

6 Claims, 4 Drawing Figures

1

LOGIC LEVEL CONVERSION SYSTEM

BACKGROUND OF THE INVENTION

This invention relates to logic systems in general and more particularly to a circuit arrangement for carrying out levels and requiring different supply voltage.

Various logic and switching systems have been developed, with each system using operating voltages which are selected primarily in dependence on the use to which the system is to be put. Thus, in logic systems for computers it is customary to use relatively low logic levels and low logic level voltage swings. On the other hand circuits developed for heavy industrial use where a large amount of interference is expected generally used higher logic levels and require a higher supply voltage. In such systems there is a larger signal excursion between the logic levels which are interpreted as a logical "0" and those interpreted as a logical "1". Using large signal excursions and larger voltages has as its primary advantage a higher signal to noise ratio. Furthermore, by designing logic circuits to operate at higher voltages there is less possibility of the circuits being destroyed by spurious voltages which may occur in the apparatus. Computer circuits, on the other hand, are generally not subject to such inteference and need not be designed to withstand destructive voltages. Thus, they operate at lower logic levels and in turn have a lower signal to noise ratio or signal to noise margin.

There is, however, an increasing use of computers and computer technology in industrial controls. As a result, computer systems must be interfaced with logic systems operating at higher levels. Typical of the systems now being used are those in which a central computer, typically a small computer utilizing large scale integration techniques is used to accept inputs from and provide outputs to logic systems associated with industrial controls. Naturally, the computer operates on low logic levels compatible with its integrated circuit design. On the other hand, the industrial control logic systems operate on a considerably higher voltage in view of the requirements for high signal to noise margin and the ability to withstand voltage spikes and the like. As a result, a need for means to inerface the two systems arises. In other words, means to convert from one set of logic levels to the other in both directions are required. Typically, such is carried out through the use of suitable level converters such as those described in Electronic 1971, No. 4, pp 111 to 116, FIG. 21.

However, where separate level converters are used for each input and output the system cost and complexity is greatly increased. Furthermore, problems arise in achieving a balanced signal to noise margin between the logic levels of the different logic systems. In view of this, the need for an improved system with avoids these difficulties existing in the prior art becomes evident.

SUMMARY OF THE INVENTION

The present invention provides an arrangement which facilitates level shifting between systems operating at different logic levels. To accomplish this object, the supply voltage for the logic system having the smaller signal excursion is obtained from a pair of zener diodes connected between the potential in the system having higher voltage excursions, i.e. the voltage corresponding to a logic "1" which will normally be a positive potential and will be assumed so herein and the reference potential, typically ground representing a logical "0". The upper potential, corresponding to a logic "1" for the system with a smaller excursion is taken from the zener diode closest to the potential and the reference potential for that system from the junction between the two zener diodes, thus corresponding to the voltage across the second zener diode. In other words, the reference potential for this system, assuming the first system's reference potential is at ground, will no longer be at ground but will be offset a fixed amount thereabove.

Through this arrangement it is possible to incorporate a logic system having small signal excursions, for example a highly integrated computer, directly into a logic system using large signal excursions and interference proof switching circuits such as the type used with industrial controls. By appropriately selecting the offset voltage between the reference potentials in the two systems direct signal transmission between the two logic systems with improved signal to interference margin is made possible.

DETAILED DESCRIPTION OF THE PREFERRED EMBODIMENT

Figure 1:
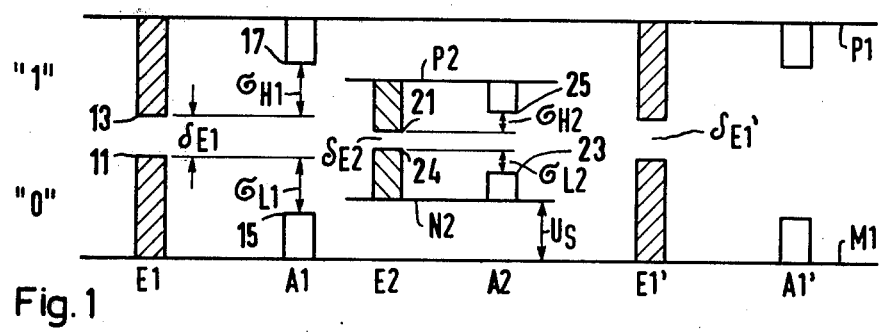
FIG. 1 is a schematic presentation illustrating the relationships between signal levels and in the different systems and also illustrating the concept of signal to noise margin.

For purposes of explaining the present invention an arrangement in which a first logic system 1 having high signal level ranges provides inputs to a logic system 2 having smaller signal excursions and levels and in which the logic system 2 provides outputs to a third logic system 1' having the same large signal excursions as the system 1 will be presumed. It will be recognized, of course, that the systems 1 and 1' will generally be parts of the same system. FIG. 1 illustrates the various logic levels used in two such systems. As illustrated by FIG. 1 the supply voltage for the system having large excursions is between a reference potential M1 and a potential P1. The reference M1 can be thought of being at a ground level although such is not necessary and the reference P1 at a level thereabove. The voltage between the levels M1 and P1 is the supply voltage for both the system 1 from which inputs are obtained and the system 1' to which outputs are provided from the system 2 having lower levels. In FIG. 1 the designations E represent input voltages or levels to which a logic system will respond and A the output levels which are expected from that system. Thus, for the systems 1 and 1' the input levels E1 and E1' are shown in crosshatched form. As illustrated, in the systems 1 and 1' any voltage level between the lower reference M1 and a level 11 will be interpreted as a logic "0". A voltage somewhere between the upper reference level P1 and the level 13 will be interpreted as a logic "1". The area designated $\delta_{E1}$ is an undefined area. A1 designates the output levels which can be expected from the logic circuits in the systems 1 and A1' the same for the system 1'. It will be recognized that the output tolerances are much less than the input tolerances. Thus, the output of a logic circuit in the system 1 or 1' will always be within the limits of the level M1 and the level 15 for a logic "0" and between the level P1 and 17 for a logical "1". The difference between the maximum value at level 15 which a logic "0" output can take and the maximum value to which a logic circuit in that system will respond and interpret the signal as a logical "0" is designated as $\sigma_{L1}$. This is the signal to noise margin. As long as noise is not in excess of this amount a logic "0" signal will always be interpreted by another logic circuit in that system as a logic "0". Similarly, the difference between the level 17, representing the lowest possible level at which an output of logic "1∞ will be provided and the level 13, the lowest level at which a circuit will positively respond to indicate a logic "1" at its input is designated $\sigma_{H1}$. The same relationship is found in both logic systems 1 and 1'.

In the logic system 2 which operates with lower levels and lower level changes an input signal E2 will be interpreted as a logic "0" if it is between the level N2 and the level 19. Similarly it will be interpreted as a logic 1 if between the level 21 and the level P2. The output ranges for this system designated A2 will be as shown with the signal to noise margin $\sigma_{L2}$ and $\sigma_{H2}$ exiting within the system. As illustrated on FIG. 1, in accordance with the present invention, the reference level or potential N2 in the system 2 is offset from the reference potential M1 by an amount $U_S$. In the example, it is raised by this amount, the level P1 being assumed to be positive with respect to the level M1. It should be recognized, however, that the present invention will work equally well in systems where a voltage P1 more negative than the voltage M1 is used. In accordance with the present invention, it is preferable that the undefined range $\delta_{E2}$ in the systems operating with lower voltages be such that it is smaller than the smallest possible signal excursion between output signal levels in the system 1. If the offset voltage $U_S$ is chosen so this is true, it is then possible to process output signals from the system 1 directly in the system 2. Furthermore, if the offset voltage $U_S$ is chosen so that the undefined range $\delta E_{1'}$ between the input signal level ranges in the system 1' is smaller than the smallest signal excursion between the output signal levels in the system 2, then it is possible to process output signals of the system 2 directly in the system 1'. The first condition mentioned above requires that $\delta_{E2}$ be smaller than the range between the levels 15 and 17 which is the smallest possible excursion between a logic 0 and a logic 1 in the system 1. The second requirement is that the range $\delta E_{1'}$ be less than the smallest signal excursion in the output A2 of the system 2. This is the excursion between levels 23 and 25. It is furthermore essential that the offset voltage $U_S$ be such that the undefined area $\delta E_{1'}$ is essentially symetrically disposed between the levels 23 and 25. Through a proper arrangement to obtain the relative levels as shown on FIG. 1 it is possible to transmit data directly from the system 1 into the system 2 and from the system 2 to the system 1'.

A particularly important advantage of the circuit of the present invention can be seen by considering the effect of signal to noise margins in the individual systems. The signal to noise margins of the system 1 designated $\sigma_{H1}$ and $\sigma_{L1}$ are in effect transmitted to the system 2. In a practical sense this means that the logic system 2 having a signal to noise ratio specific to that system will now have the signal to noise margin of the system 1 i.e. will have the large signal to noise margin specific to that system. In more concrete terms, even if a signal such as signal A1 starts at a level 15 and has noise thereon which raises it to the level 11, for example, the system 2 will still respond to that signal as a logic "0". Similarly if noise lowers a signal at the level 17 to the level 13 the system 2 will still respond to that signal as a logic "1".

Figure 2:
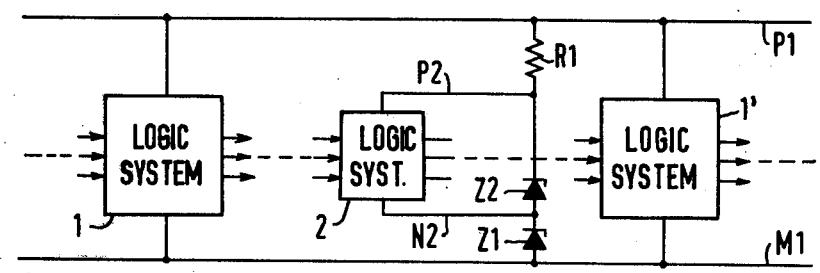
FIG. 2 is a block diagram of the system according to the present invention.

FIG. 2 is a block-schematic diagram illustrating an implementation of logic systems to obtain what is illustrated by FIG. 1. In this drawing the block 1 respresents a logic system having relatively high logic levels, i.e. operating generally between the levels M1 and P1 and having large signal excursions. The system is shown as having a plurality of inputs and a plurality of outputs with at least some of the outputs coupled into a logic system 2. Logic system 2 is shown with a plurality of inputs and outputs, some of the inputs coming from the logic system 1 and at least some of the systems outputs being provided to a logic system 1' also having a plurality of inputs and outputs. In actual practice, the logic system 1' could be considered a portion of the logic system 1 but for purposes of illustration it is shown separately. Both the logic system 1 and 1' receive power from the lines designated M1 and P1 which will be at the relative voltage levels illustrated on FIG. 1.

In accordance with the present invention power is supplied to the logic system 2 from the same power supply supplying the voltages M1 and P1 through the use of a series circuit comprising a resistor R1 and two zener diodes Z1 and Z2. The two zener diodes Z1 and Z2 and the resistor R1 are in series across the voltages P1 and M1. The level P2 is taken off from this series circuit at the junction of the resistor R1 and zener diode Z2. The lower level N2 is taken off from the jucntion of the zener diode Z1 and Z2. Thus, the breakdown voltage of the zener diode Z1 establishes the offset voltage $U_S$ and the reference voltage or potential level N2. The voltage drop across the two zener diodes establishes the level P2 or, in other words, the difference between the levels N2 and P2 is determined by the zener diode Z2.

Typically, an arrangement of this nature will be placed within a single, space such as within a switching cabinet. In such an arrangement, sub-assemblies of the logic system 2 will be employed obtaining their input signals from external assemblies including portions of the logic system 1. Typically, the logic system 2 will perform certain data processing and will provide output signals which are converted by means of closely adjacent sub-assemblies of the logic system 1 to the levels used in that system. The interference in this data transfer from system 2 to system 1' can be kept particularly low because the signal transfer takes place between closely adjacent sub-assemblies. Furthermore, because of short lead lengths, the possibility of capacitive or inductive stray coupling is small. With this arrangement, an improvement in the signal to noise margins through a suitable choice of the offset voltage can be accomplished such that during the signal transfer from system 1 to system 2 particularly large interference signal margins are available and signal transfer within the switching cabinet becomes quite reliable.

FIG. 2 shows in more detail an embodiment in which the logic system 2 is designed for small signal excursions using COS/MOS technology. Once again, the supply voltage for the logic system 2 is obtained from a series connection of zener diodes Z1 and Z2 and a resistor R1. Once again, the offset voltage is obtained from the zener diode Z1 to result in a lower reference voltage N2 for this system. This figure illustrates how the inputs and outputs of this system are handled. At the input to the logic system 2, a resistor R2 is provided coupling in a signal from the system 1. At the system 1 side of this resistor, a resistor R3 to the level M1 is provided. Within the system 2, for interfacing purposes, diodes D1 and D2 with a resistor therebetween are provided. These diodes are by-pass diodes coupling the input line, through the resistor R1 to the level or voltage P1. In addition, a diode D3 coupling the input to the level N2 is provided. Consider first what occurs when a logic "1" signal from the system 1 is provided into the system 2. This will be a signal at a level between the level 17 and the level P1 shown on FIG. 1. By-pass diodes D1 and D2 will clamp the signal to voltage P2. Thus, a voltage at the level P2 will appear at the point 27. The resistor R2 acts a current limiting resistor to limit current between the two systems. If a low or logic "0" signal, i.e. one between the levels M1 and 15 of FIG. 1, appears at the output of the logic system 1, it will be clamped to the level N2 by means of the diode D3 and at the point 27 a logic signal at that level will appear. The reisstor R3 will be of a relative low resistance as compared to the series resistor R2. This circuit is required where the signal output of the system 1 does not draw current for a "0" logic system and avoids dragging down the level N2. Furthermore, it acts as a discharge resistance in the case of a capacitively influenced signal input. The signal input at point 27 could of course then be processed in logic circuits within the system 2. For purposes of illustration, however, it is shown as being more or less connected directly to a pair of complementary transistors T1 and T2. In other words, numerous logic and computing circuits could be inserted between the input point 27 and the output transistors T1 and T2 in the logic system 2 illustrated. However, for purposes of illustration, FIG. 3 simply illustrates the manner in which the logic levels are shifted from the high levels of the system 1 to the lower levels of the system 2 and then provided as appropriate outputs to the system 1'. In the arrangement of the output transistors T1 and T2, a transversal current flows through both transistors during the switching of the output signal. The magnitude of the transversal current depends on the mangitude of the supply voltage. In COS/MOS circuits this transversal current increases quadratically with the supply voltages. Thus, if the signals are switched slowly there is a danger that, beacause of an excessive transversal current a thermal overloading of the switching current can take place which can lead to its destruction. In accordance with the present invention, however, the COS/MOS system in system 2 operates with a lower supply voltage and thus the transversal voltages are kept smaller. Thus, although the system 2 retains the signal to noise margin of the system 1 levels, no excessive thermal stresses on the transistors and no pulse stress of the power supply occurs even in the case of small switching processes. In well known fashion, in response to a logic "1" signal at the point 27 the complementary transistor T1 and T2 will provide a level at the output to the system 1' which is essentially at the level P2. Similarly, in response to a "0" logic level at the input point they will provide an output essentially at the level N2 representing a logical "0". With reference to FIG. 1, it can be seen that because of the offset $U_S$, these signals will be properly interpreted by the system 1' since they are within the ranges E1'.

Figure 3:
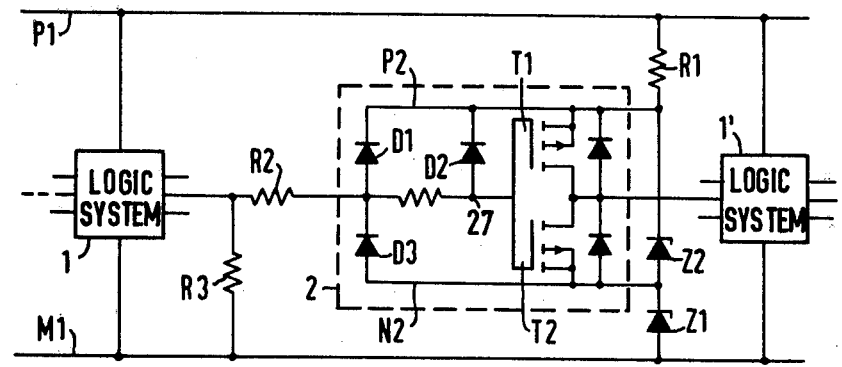
FIG. 3 is a diagram illustrating portions of the diagram of FIG. 2 schematically.
Figure 4:
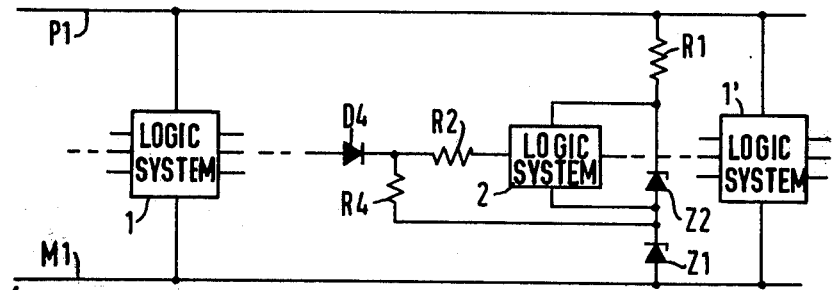
FIG. 4 is a block diagram illustrating an alternate to the embodiment of FIG. 3.

FIG. 4 illustrates an alternate embodiment of the system of the present invention. In the illustrated arrangement, the input from the system 1 is coupled through a diode D4 and a resistor R2 into the system 2. A resistor R4 couples the junction point between diode D4 and resistor R2 to the junction of the zener diode Z1 and Z2. This arrangement which replaces the resistors R3 in the embodiment of FIG. 3 is another manner of insuring that the offset voltage N2 is not dragged down and furthermore insures a defined termination of the signal input.

Thus, an improved system for interfacing logic systems operating at different levels has been shown. Although specific embodiments have been illustrated and described, it will be obvious to those skilled in the art that various modifications may be made without departing from the spirit of the invention which is intended to be limited solely by the appended claims.

What is claimed is:

1. In an arrangement in which two logic systems, having different logic level excursions, one having a large excursion and requiring a higher supply voltage and the other having a smaller excursion and requiring a lower supply voltage, are interfaced with each other, the logic system having a higher supply voltage being supplied with a reference potential M1 and a potential P1, the improvement comprising:
    a. a series circuit including first and second series zener diodes and a resistor coupled between the potential P1 and the reference potential M1, the resistor having its free end coupled to the potential P1;
    b. a first line from the junction point of said resistance and said series zener diodes providing a potential P2 and a second line from the junction between said series zener diodes providing a reference potential N2 for said logic system requiring a lower supply voltage; and
    c. wherein said two logic systems have their inputs and outputs connected together through circuits not including level converters.

2. Apparatus according to claim 1 wherein, within said low voltage logic system, complementary output transistor stages are provided and further including a series resistor coupling the output of said high voltage logic system to an input of said low voltage logic system.

3. Apparatus according to claim 2 and further including a load resistor having a smaller resistance value than said series resistor coupling the output of said high voltage logic system to said reference potential.

4. Apparatus according to claim 2 and further including a diode in series with said resistor coupling an output of said high voltage logic system to an input of said low voltage logic system and a load resistor coupling the junction of said diode and series resistor to the junction point of said first and second zener diodes.

5. Apparatus according to claim 2 wherein said low voltage logic system is a system constructed using COS/MOS technology.

6. In an arrangement in which two logic systems, having different logic signals ranges, one having a large signal range and requiring a higher supply voltage range and the other having a smaller signal range and requiring a lower supply voltage range are interfaced with each other, the logic system having a higher supply voltage range being supplied with a reference potential M1 and a potential P1, the improvement comprising:

a. a series circuit including first and second series zener diodes and a resistor coupled between the potential P1 and the reference potential M1, the resistor having its free end coupled to the potential P1;

b. a first line from the junction point of said resistance and said series zener diodes providing a potential P2 and a second line from the junction between said series zener diodes providing a reference potential N2 for said logic system requiring a lower supply voltage range, the reference potential N2 for said logic system requiring a lower supply voltage range being offset from the reference potential M1 for said logic system requiring a higher supply voltage range by a predetermined voltage amount; and c. the predetermined voltage amount being defined so that the undefined range between the input signals in the logic system having a smaller signal range is smaller than the minimum range between the output signal levels in the logic system having a large signal range and being disposed symmetrically thereto, and the undefined range between the input signals in the logic system having a large signal range is smaller than the minimum range between the output signal levels in the logic system having a smaller signal range and being disposed symmetrically thereto, whereby said two logic systems may have their inputs and outputs connected together without the use of level converters.

* * * * *